United States Patent [19]
Tonegawa et al.

[11] Patent Number: 5,297,119
[45] Date of Patent: Mar. 22, 1994

[54] DATA STORAGE APPARATUS

[75] Inventors: Nobuyuki Tonegawa, Kawasaki; Syuji Yamaguchi, Tokyo, both of Japan

[73] Assignee: Casio Computer Co., Ltd., Tokyo, Japan

[21] Appl. No.: 798,619

[22] Filed: Nov. 26, 1991

[30] Foreign Application Priority Data

Nov. 30, 1990 [JP] Japan .................................. 2-128002
Nov. 30, 1990 [JP] Japan .................................. 2-334527
Dec. 27, 1990 [JP] Japan .................................. 2-402495

[51] Int. Cl.$^5$ .............................................. G04B 45/00
[52] U.S. Cl. ........................................ 368/41; 371/66; 371/16.5; 364/705.07; 364/705.08
[58] Field of Search ................................. 368/41-44; 364/705.07, 705.08, 707; 371/16.5, 29.1, 66

[56] References Cited

U.S. PATENT DOCUMENTS 3,971,205  7/1976  Nomura et al. .
4,564,922  1/1986  Muller .
5,153,881  10/1992  Bruckert et al. .................. 371/11.3

FOREIGN PATENT DOCUMENTS 0075825  4/1983  European Pat. Off. .
0124092  11/1984  European Pat. Off. .
2442394  3/1975  Fed. Rep. of Germany .

OTHER PUBLICATIONS

Patent Abstracts of Japan, vol. 14, No. 474, Oct. 16, 1990 and JP-A-21 90 715 (Tokico), Jul. 26, 1990.
Patent Abstracts of Japan, vol. 15, No. 37, Jan. 29, 1991 and JP-A-22 75 506 (Amada Metrex Co), Nov. 9, 1990.
Patent Abstracts of Japan, vol. 15, No. 5, Jan. 8, 1991 and JP-A-22 54 320 (Kimmon Mfg Co.), Oct. 15, 1990.
Patent Abstracts of Japan, vol. 12, No. 129, Apr. 21, 1988 and JP-A-62 251 912 (Miyata Mutsumi), Feb. 1987.
Patent Abstracts of Japan, vol. 8, No. 10 (P-248)(1446) Jan. 18, 1984 and JP-A-58 169 395 (Fujitsu), Oct. 5, 1983.

Primary Examiner—Bernard Roskoski
Attorney, Agent, or Firm—Frishauf, Holtz, Goodman & Woodward

[57] ABSTRACT

Data input through a key switch is displayed on a liquid crystal display and is stored in an EEPROM. The data stored in the EEPROM is immediately read out to check whether the read data coincide with the input data. If the data stored in the EEPROM and read out therefrom does not coincide with the input data, the input data is stored again. If the input data cannot be stored in the EEPROM after storage operation is performed a predetermined number of times, a CPU determines, on the basis of a signal from a battery voltage detecting circuit, whether a voltage applied from a power supply circuit to the EEPROM exceeds a predetermined voltage. On the basis of this determination result, the CPU causes the liquid crystal display to display a cause for the disabled storage operation with respect to the EEPROM.

23 Claims, 13 Drawing Sheets

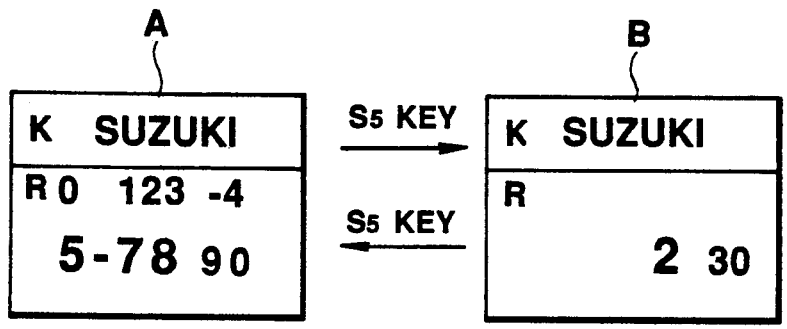
FIG.10
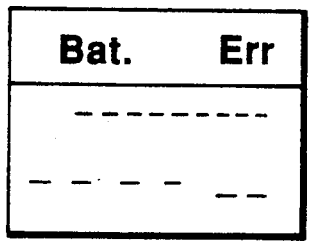 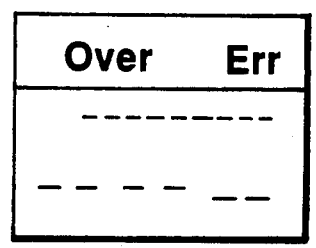
FIG.11     FIG.12

DATA STORAGE APPARATUS

BACKGROUND OF THE INVENTION

1. Field of the Invention

The present invention relates to a data storage apparatus for storing various data in a nonvolatile memory such as an EEPROM by using a battery as a power supply.

2. Description of the Related Art

In conventional data storage apparatuses such as an electronic notebook and an electronic wristwatch, various types of data, e.g., name/telephone-number data and schedule data, are stored in a RAM. Power is supplied from a battery to the RAM to preserve the stored contents. When the voltage of the battery is decreased, the exhaustion of the battery is informed to a user. In order to prevent the stored contents from being lost upon replacement of the exhausted battery, for example, a large-capacitance capacitor is connected in parallel with the RAM. With this arrangement, the data stored in the RAM is preserved for a predetermined period of time until the discharge voltage of the capacitor is decreased, thus allowing the user to replace the battery with a new one within the predetermined period of time.

In a conventional data storage apparatus, however, if replacement of a battery is not performed when it is necessary, the data stored in the RAM is lost. For this reason, the use of a nonvolatile memory such as an EEPROM (electrically erasable and programmable read only memory) capable of preserving the stored contents when the power supply is turned off has been proposed.

An EEPROM is designed to perform a write operation at a high voltage. If, therefore, the battery voltage is not sufficiently high, data cannot be properly written. In addition, the EEPROM has a data write count limit. If a write operation is repeatedly performed a number of times exceeding a predetermined number, normally, no more data can e written in the corresponding storage area.

In general, when various data such as name/telephone-number data and schedule data are to be stored in an EEPROM, since data editing is frequently repeated, the data write count is increased. Therefore, when a data write operation with respect to the EEPROM is disabled, the user cannot judge whether the write operation is disabled by the exhaustion of the battery or an excessive data write count.

SUMMARY OF THE INVENTION

The present invention has been made to solve the above problems, and has as its object to provide a data storage apparatus which can inform a cause for a disabled data write operation with respect to a nonvolatile memory.

In order to achieve the above object, according to the present invention, there is provided a data storage apparatus comprising a battery power supply, data input means for inputting data, nonvolatile memory means, operated by a power supply voltage from said battery power supply, for storing data input by said data input means, write determination means for determining whether the data is written in said nonvolatile memory means, voltage detecting means for detecting a voltage of said battery power supply when said write determination means determines that the data cannot be written, and informing means for informing, on the basis of a detection result obtained by said voltage detecting means, whether the data cannot be written because of a decrease in voltage of said battery power supply or any other factors.

With this arrangement, according to the present invention, when a data write operation is disabled, the cause for the disabled operation can be informed, i.e., whether it is caused by a decrease in battery voltage or any other factors. Therefore, a user can be urged to replace the battery. In addition, this can prevent the user from stopping the use of a certain storage area by misjudging that the data write count limit is exceeded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 12 show the first embodiment of the present invention, in which:

FIG. 1 is a perspective view of an electronic wristwatch,

FIG. 2 is a perspective view showing the arrangement of a display portion,

FIG. 3 is a block diagram showing the circuit arrangement of the electronic wristwatch, FIG. 4 is a block diagram showing the circuit arrangement of a battery voltage detecting section, FIG. 5 is a view showing the memory architecture of a RAM, FIG. 6 is a view showing the memory architecture of an EEPROM, FIG. 7 is a flow chart showing the overall operation, FIG. 8 shows changes in display during a data setting operation, FIG. 9 is a flow chart showing the process of storing data in the EEPROM, and FIGS. 10 to 12 are views respectively showing display states; and FIGS. 13 to 19 show the second embodiment of the present invention, in which:

FIG. 13 is a block diagram showing the circuit arrangement of an electronic wristwatch, FIG. 14 is a view showing the memory architecture of a RAM 106, FIG. 15 is a view showing the memory architecture of an EEPROM 107, FIGS. 16 and 17 are flow charts respectively showing sequences of operations, FIG. 18 is a view showing display states, and FIG. 19 is a view showing another display state.

DETAILED DESCRIPTION OF THE PREFERRED EMBODIMENTS

First Embodiment

An embodiment of the present invention will be described below with reference to FIGS. 1 to 12. In this embodiment, a data storage apparatus of the present invention is applied to an electronic wristwatch.

Figure 1:
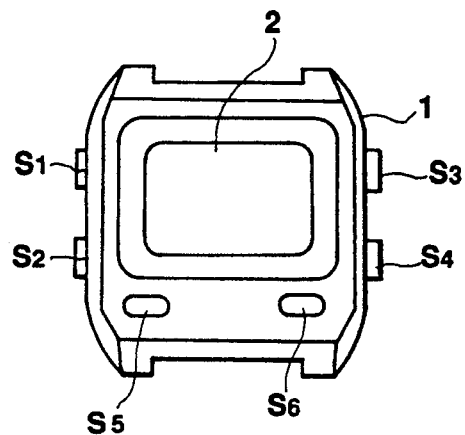

FIG. 1 is a perspective view of an electronic wristwatch to which the present invention is applied. An LCD (liquid crystal display panel) 2 and $S_1$ to $S_6$ keys of a push-button type are arranged on an electronic wristwatch main body 1. The $S_1$ key is used to invert the content of a mode register M (to be described later). The $S_2$ key is a key for inverting the content of a flag register F to switch a data display state and a set data display state with each other when "M = 1". The $S_3$ key serves to perform sequential searches for data stored in a RAM (to be described later) and select a digit position in data correction. The $S_4$ key is used to perform sequential searches for data stored in an EEPROM (to be described later) and perform character selection for data correction. The $S_5$ key serves to display a data write count with respect to the EEPROM. The $S_6$ key is used for other processing.

Figure 2:
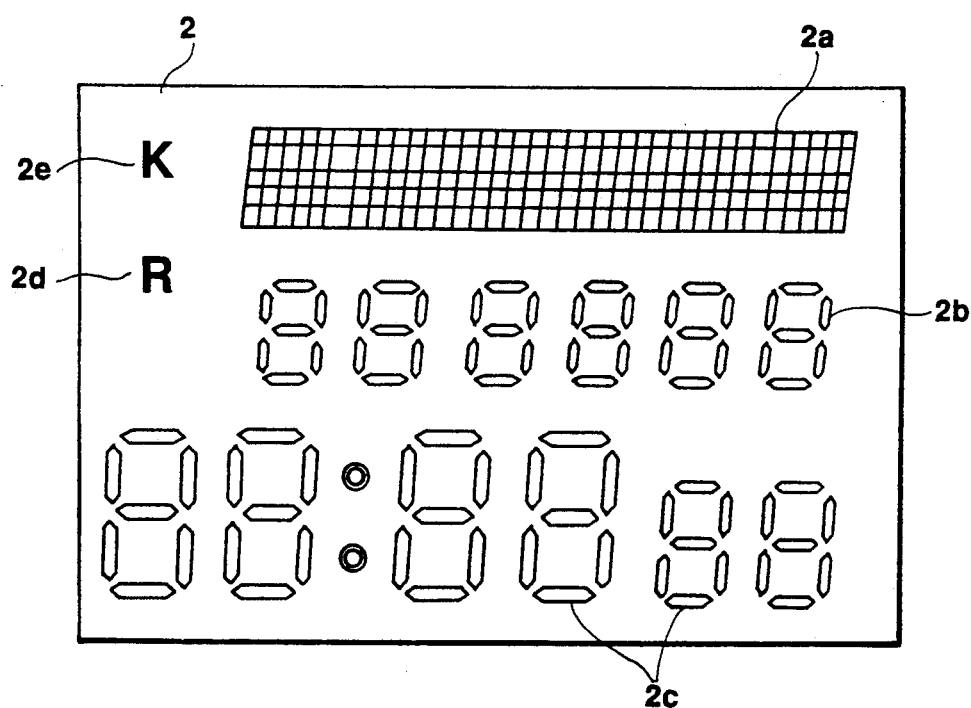

FIG. 2 shows the arrangement of the LCD 2. The LCD 2 comprises a dot matrix display portion 2a for displaying characters, numeric segment display portions 2b and 2c for displaying numerals, a reservation completion mark ("R" display element) display portion 2d, and a "keep" mark display portion ("K" display element) 2e. The dot matrix display portion 2a displays name data included in name/telephone-number data. The numeric segment display portions 2b and 2c display time data or telephone number data included in the name/telephone-number data. The reservation completion mark (R) display portion 2d indicates that the process of reserving the name/telephone-number data, displayed on the dot matrix display portion 2a and the numeric segment display portions 2b and 2c, in an EEPROM 7 is completed. The "keep" mark display portion (K) 2e indicates that the displayed name/telephone-number data is kept in the EEPROM 7.

Figure 3:
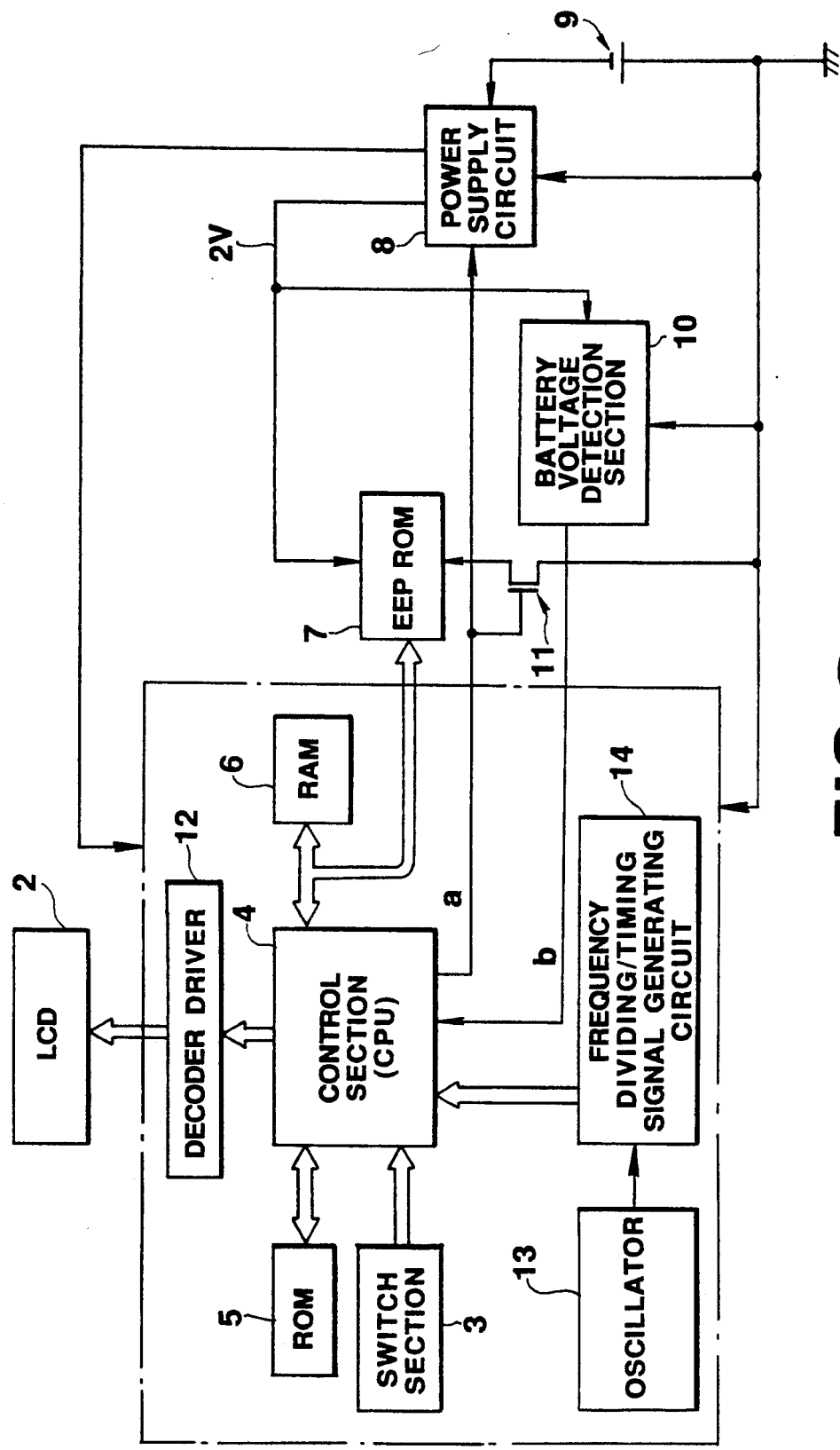
Figure 4:
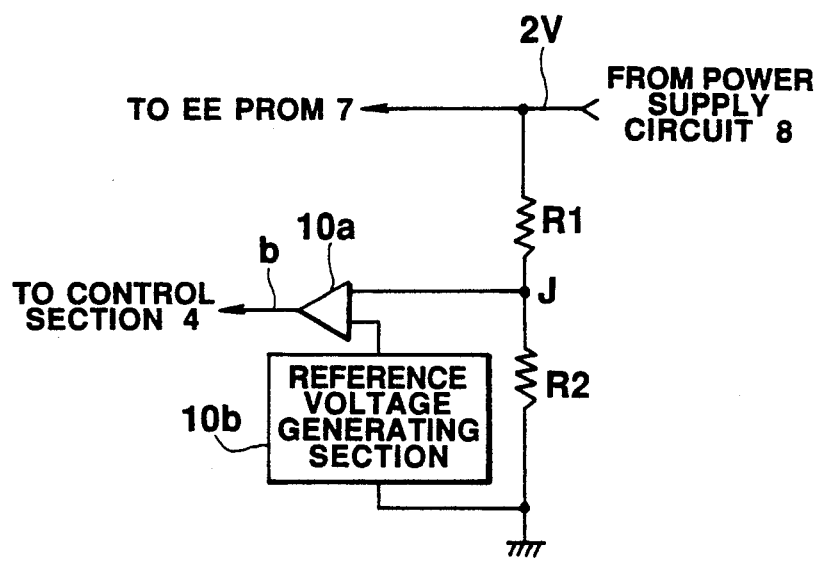

FIG. 3 is a block diagram showing the circuit arrangement of the electronic wristwatch. Referring to FIG. 3, a switch section 3 includes the $S_1$ to $S_6$ keys shown in FIG. 1, and serves to output a key input signal corresponding to a key input to a control section 4. The control section 4 (CPU) is a central processing unit for performing various types of processing in accordance with microprograms stored in a ROM 5 in advance. A RAM 6 as a volatile memory serves to store various types of data, e.g., name/telephone-number data. Reference numeral 7 denotes an EEPROM as a nonvolatile memory for storing arbitrarily selected name/telephone-number data. A power supply circuit 8 applies a driving voltage (a rated voltage of 1.5 V) to the respective components in accordance with a voltage (3 V) applied from a lithium battery 9, and also supplies a predetermined voltage of e.g., 2 V to the EEPROM 7 in response to a signal a output from the control section 4.

A battery voltage detecting section 10 determines whether the driving voltage output from the power supply circuit 8 is proper, i.e., 2 V or more, and outputs a detection signal b to the control section 4 if the driving voltage is lower than 2 V. The battery voltage detecting section 10 will be described in detail below with reference to FIG. 4. The driving voltage of 2 V output from the power supply circuit 8 is divided into voltages of 1 V by voltage-dividing resistors R1 and R2. A voltage (a rated voltage of 1 V) at a node J between the voltage-dividing resistors R1 and R2 is applied to one input terminal of a comparator 10a. In addition, a reference voltage of, e.g., 1 V is applied from a reference voltage generating section 10b to the other input terminal of the comparator 10a. The comparator 10a compares the voltage at the node J with the reference voltage (1 V). If the voltage at the node J is lower than the reference voltage (1 V), the comparator 10a outputs the detection signal b to the control section 4.

Referring to FIG. 3 again, a MOS transistor 11 is a gate element for controlling the supply of power to the EEPROM 7. More specifically, the MOS transistor 11 is turned on in response to the signal a output from the control section 4 to connect the EEPROM 7 to the ground voltage (GND). A decoder driver 12 outputs a display driving signal, based on display data output from the control section 4, to the LCD 2. An oscillator 13 incorporates a quartz oscillator and serves to output, e.g., a 32-k(32768)Hz clock pulse to a frequency dividing/timing signal generating circuit 14. The frequency dividing/timing signal generating circuit 14 frequency-divides the clock pulse supplied from the oscillator 13 to generate various types of timing signals such as a timepiece signal. The circuit 14 then outputs the timing signals to the control section 4.

Figure 5:
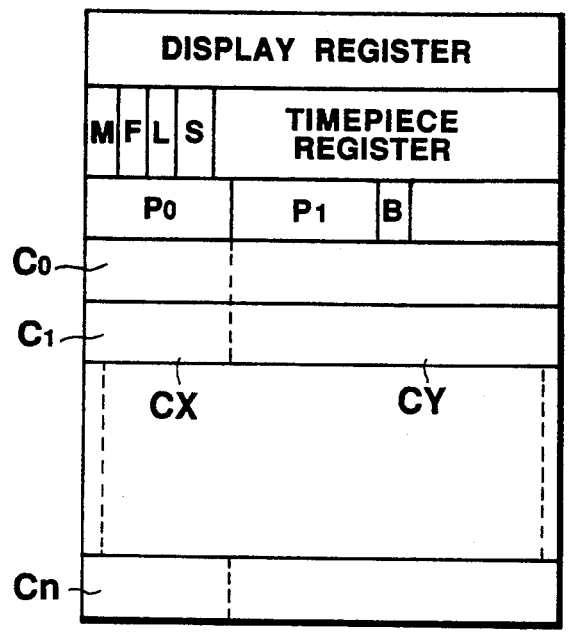

FIG. 5 shows the memory architecture of the RAM 6. As shown in FIG. 5, the RAM 6 includes various types of registers and TEL data memories $C_0$ to $C_n$ for storing name/telephone-number data. A display register is a register for storing data to be displayed on the LCD 2. A mode register M stores mode data. When M = 0 (the value of the register M is "0"), the current time display mode is set. When M = 1 (the value of the register M is "1"), the data display mode is set. A flag register F stores a flag indicating whether data correction is being performed. A flag register L stores a selection flag indicating whether the RAM 6 or the EEPROM 7 is selected in a data read/write operation. When L = 0, the RAM 6 is selected. When L = 1, the EEPROM 7 is selected. A register S is a try counter for counting the number of times that write operations are executed with respect to the EEPROM 7. A timepiece register serves to store current time data (date and time) counted by the control section 4. A register $P_0$ is a pointer for designating the address of each of the TEL data memories $C_0$ to $C_n$. A register $P_1$ is a pointer for designating the address of each of TEL data memories $D_0, D_1, \ldots$ in the EEPROM 7 shown in FIG. 6. A register B stores data indicating a cause for a disabled write operation with respect to the EEPROM 7. If the disabled write operation is caused by a decrease in battery voltage, "B = 1" is set. If the disabled write operation is caused by other factors, e.g., an excessive data write count, "B = 2" is set. In each of the TEL data memories $C_0$ to $C_n$, alphabetical name data is stored in an area CX, and telephone number data consisting of numerals and a symbol (hyphen) is stored in an area CY.

Figure 6:
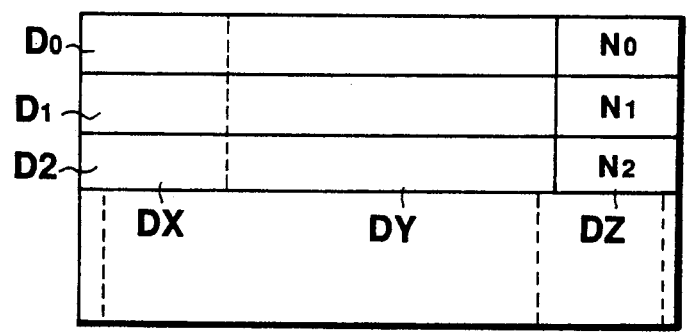

FIG. 6 shows the memory architecture of the EEPROM 7. As shown in FIG. 6, a large number of TEL data memories $D_0, D_1, \ldots$ are arranged in the EEPROM 7. In each of the TEL data memories $D_0, D_n, \ldots$, alphabetical name data is stored in an area DX, and telephone number data consisting of numerals and a symbol (hyphen) is stored in an area DY. In addition, data write counts $N_0$, $N_1$, $N_2$, ... with respect to the TEL data memories $D_0$, $D_1$, ... are respectively stored in areas DZ.

Figure 7:
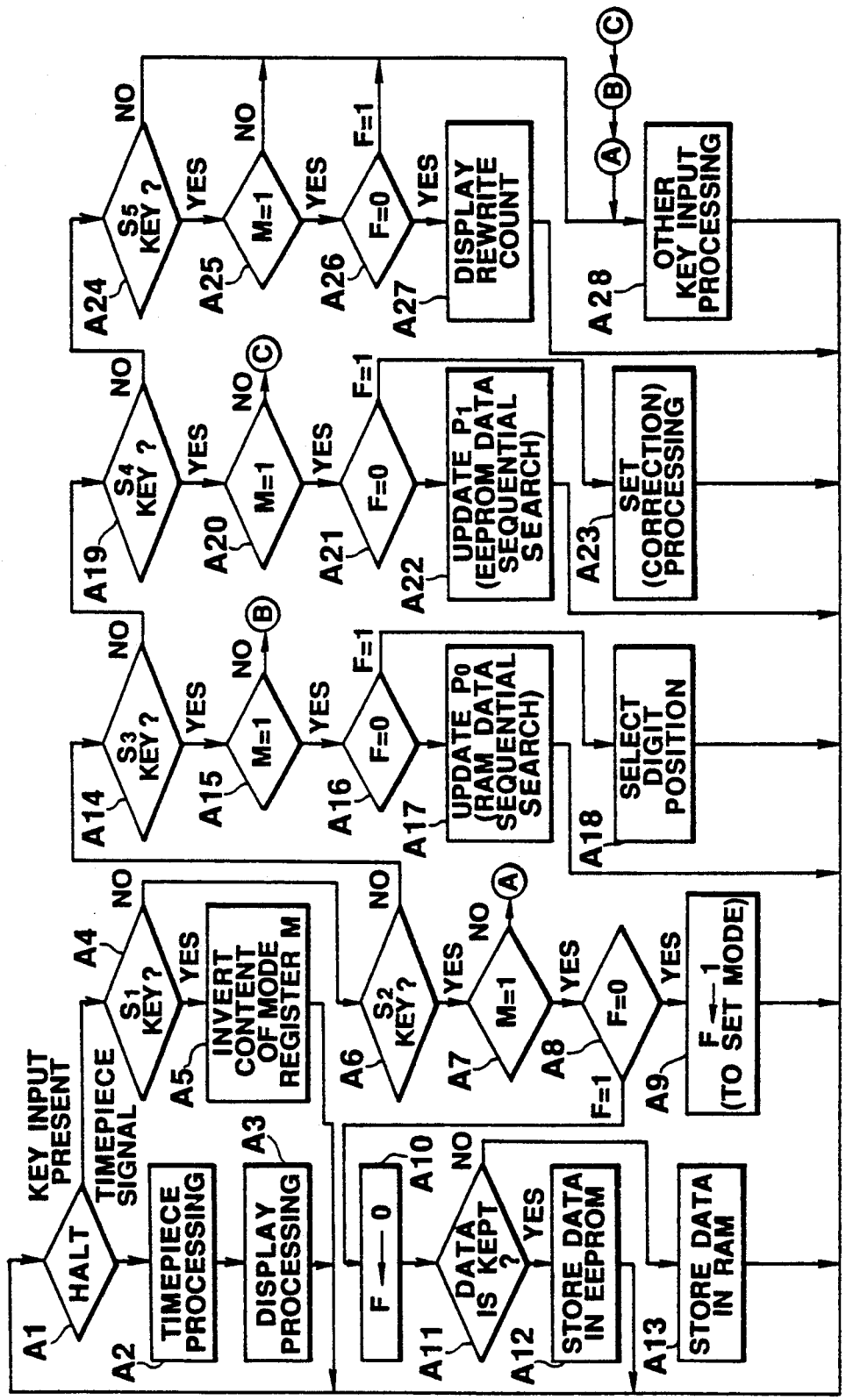
Figure 8:
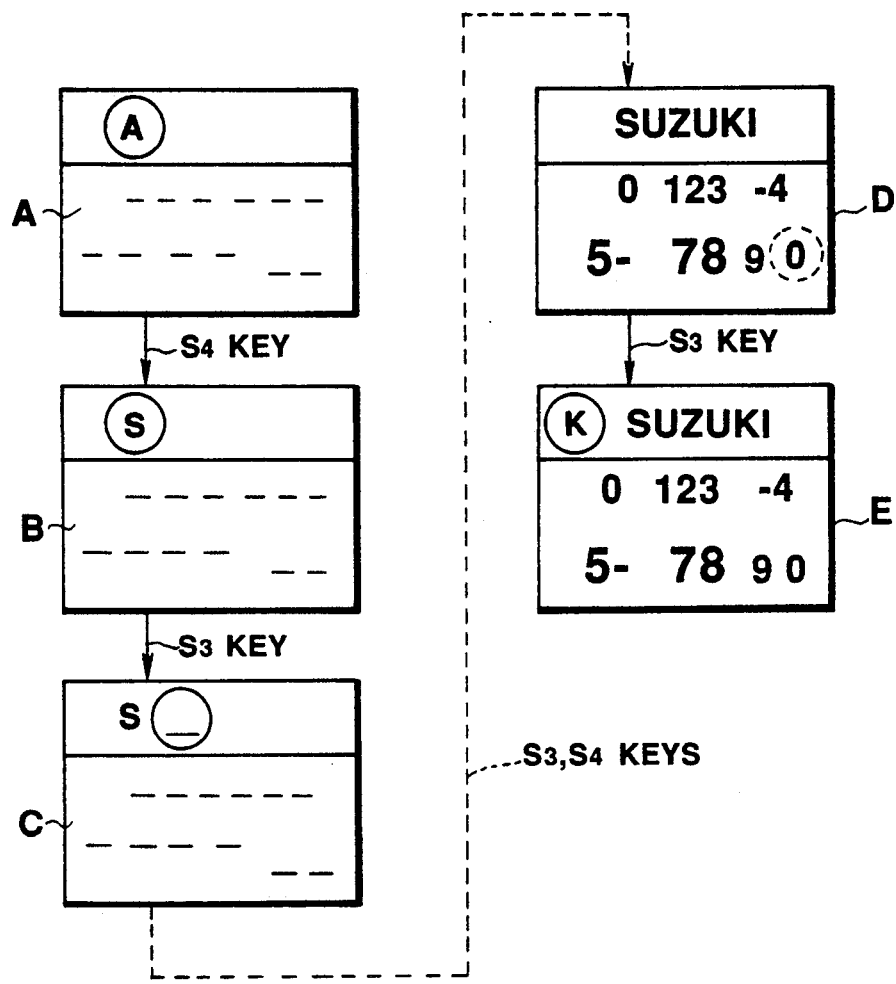
Figure 9:
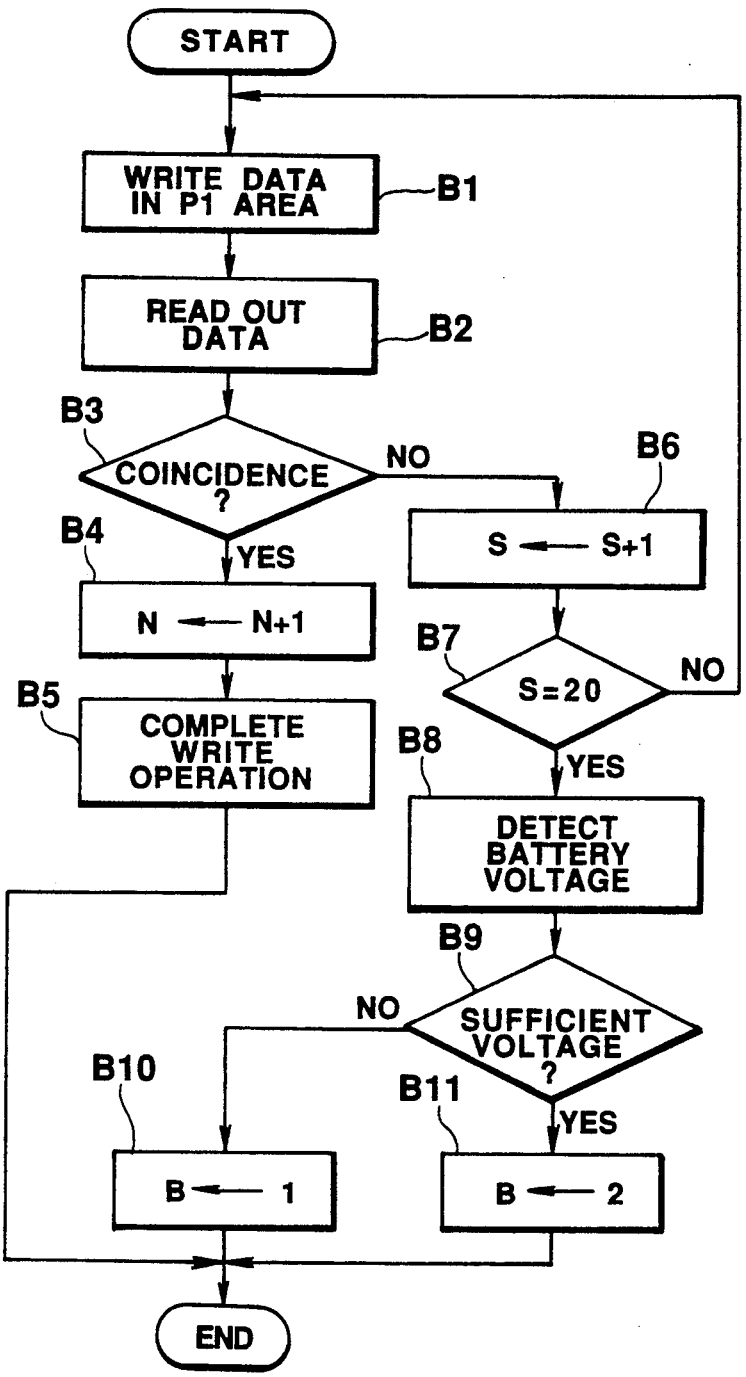

Sequences of operations of the first embodiment will be described below with reference to FIGS. 7 to 12. FIG. 7 is a flow chart showing the overall operation. FIG. 8 shows examples of display in the data set mode. FIG. 9 is a flow chart showing the process of storing data in the EEPROM 7 shown in FIG. 6. FIG. 10 shows an example of display of a data write count. FIG. 11 shows an example of display in a case wherein a write operation is disabled by a decrease in battery voltage. FIG. 12 shows an example of display in a case wherein a data write operation is disabled by an excessive data write count.

The overall operation will be described first with reference to FIG. 7. The control section 4 is kept in a HALT state in step A1 until a timepiece signal is output from the frequency dividing/timing signal generating circuit 14.

When a timepiece signal is output, the presence of the timepiece signal is determined in step A1, and the flow advances to step A2. In step A2, timepiece processing is performed to update the current time data stored in the timepiece register. In step A3, display processing is performed to display current time data, name/telephone-number data, data write count data, or the like on the LCD 2 in accordance with the contents of the mode register M and the flag register F. After step A3 is executed, the flow returns to step A1.

When one of the $S_1$ to $S_6$ keys of the switch section 3 is operated, the presence of a key input is determined in step A1, and the flow advances to step A4. In step A4, it is checked whether the operated key is the $S_1$ key. If the $S_1$ key is operated, YES is obtained in step A4, and the flow advances to step A5. In step A5, the content of the mode register M is inverted to change the mode. If, for example, the $S_1$ key is operated while "M =0", "M =1" is set to set the data display mode. After step A5 is executed, the flow returns to step A1. If the $S_1$ key is operated while "M =1" is set, the current time display mode indicated by "M =0" is set.

If NO in step A4, the flow advances to step A6. In step A6, it is checked whether the operated key is the $S_2$ key. If the $S_2$ key is operated, YES is obtained in step A6, and the flow advances to step A7. In step A7, it is checked whether "M =1" is set, i.e., the content of the mode register M is "1". If YES in step A7, the flow advances to step A8. If NO in step A7, the flow advances to step A28.

If "M =1" is set, YES is obtained in step A7, and the flow advances to step A8. In step A8, it is checked whether "F =0" is set, i.e., the content of the flag register F is "0". If YES in step A8, the flow advances to step A9. If NO (F =1) in step A8, the flow advances to step A10. If "F =0" is set, YES is obtained in step A8, and the flow advances to step A9. In step A9, "1" is written in the flag register F to set "M =1, F =1", thus setting the data set mode. After step A9 is executed, the flow returns to step A1.

If NO (F =1) in step A8, the flow advances to step A10. In step A10, "0" is written in the flag register F to set "M =1, F =0". The flow then advances to step A11. In step A11, it is checked on the basis of the content of the flag register L whether the set data is to be kept in the EEPROM 7. More specifically, if "L =1" is set, YES is obtained in step A11, and the flow advances to step A12 to perform data storage processing with respect to the EEPROM 7. As a result, the data set in the display register of the RAM 6 is stored in the EEPROM 7. The process of storing data in the EEPROM 7 will be described in detail later with reference to FIG. 9. If "L =0" is set, NO is obtained in step A11, and the flow advances to step A13 to store the set data in the RAM 6. When step A12 or A13 is executed, the flow returns to step A1.

If NO in step A6, the flow advances to step A14. In step A14, it is checked whether the operated key is the $S_3$ key.

If the $S_3$ key is operated, YES is obtained in steps A14, and the flow advances to step A15. In step A15, it is checked whether "M =1" is set. If YES in step A15, the flow advances to step A16. If NO in step A15, the flow advances to step A28. If M =1, YES is obtained in step A15, and the flow advances to step A16. In step A16, it is checked whether "F =0" is set. If YES in step A16, the flow advances to step A17. If NO (F =0) in step A16, the flow advances to step A18.

If "M =1, F =0" is set, YES is obtained in both steps A15 and A16, and the flow advances to step A17. In step A17, the address stored in the register $P_0$ is updated to execute sequential search processing with respect to the data stored in the RAM 6. Thereafter, the flow returns to step A1. If "F =1" is determined in step A16, the data set mode is set, and the flow advances to step A18. In step A18, digit position selection processing is performed, so that a correction digit position in data correction is shifted to the LSB by one digit. After step A18 is executed, the flow returns to step A1.

If NO in step A14, the flow advances to step A19. In step A19, it is checked whether the operated key is the $S_4$ key. If YES in step A19, the flow advances to step A20. If NO in step A19, the flow advances to step A24.

If the $S_4$ key is operated, YES is obtained in step A19, and the flow advances to step A20. In step A20, it is checked whether "M =1" is set. If YES in step A20, the flow advances to step A21. If NO in step A20, the flow advances to step A28. If YES in step A20, the flow advances to A21 to check whether "F =0" is set. If YES in step A21, the flow advances to step A22. If NO in step A21, the flow advances to step A23.

If "M =1, F =0" is set, YES is obtained in both steps A20 and A21, and the flow advances to step A22. In step A22, the address stored in the register $P_1$ is updated to execute sequential search processing of the data stored in the EEPROM 7. Thereafter, the flow returns to step A1. If "F =1" is determined in step A21, since the data set mode is set, the flow advances to step A23. In step A23, set (correction) processing is performed to correct a correction target character. After step A23 is executed, the flow returns to step A1.

If NO in step A19, the flow advances to step A24. In step A24, it is checked whether the operated key is the $S_5$ key. If YES in step A24, the flow advances to step A25. If NO in step A24, the flow advances to step A28.

If the $S_5$ key is operated, YES is obtained in step A24, and the flow advances to step A25. In step A25, it is checked whether "M =1" is set. If YES in step A25, the flow advances to step A26. If NO in step A25, the flow advances to step A28. If YES in step A25, the flow advances to step A26 to check whether "F =0" is set. If YES in step A26, the flow advances to step A27. If NO in step A26, the flow advances to step A28.

In this case, if "M =1, F =0" is set, YES is obtained in both steps A25 and A26, and the flow advances to step A27. In step A27, the data write counts $N_0$, $N_1$, $N_2$, ... corresponding to the TEL data memories $D_0, D_1, \ldots$ of the EEPROM 7, in which the display data is stored, are displayed on the LCD 2.

If NO in each of steps A24, A25, and A26, the flow advances to step A28 to perform other key processing. After step A28 is executed, the flow returns to step A1.

The process of setting name/telephone-number data will be described below with reference to FIG. 8. Assume that the $S_1$ key is operated to set "M = 1" by the processing in step A5, and that the $S_2$ key is operated to set "F = 1" by the processing in step A9.

With this operation, the data set mode is set, and the character "A" is flickered on the dot matrix display portion $2a$ of the LCD 2 in the display processing in step A3, as indicated by display "A" shown in FIG. 8.

In this case, if the $S_4$ key is repeatedly operated, the characters "A", "B", "C", ... are sequentially selected in this order, and the character "S" is flickered, as shown by display "B" in FIG. 8. When the displayed character "S" is to be set, the $S_3$ key is operated to select the next digit position.

With this operation, as shown by display "C" in FIG. 8, the flickered display is shifted to the second digit position of the dot matrix display portion $2a$. If the $S_3$ and $S_4$ keys are subsequently operated to set character data and numeric data in the same manner as described above, a name "SUZUKI" is displayed on the dot matrix display portion $2a$, and a telephone number "0123-45-7890" is displayed on the numeric segment display portions $2b$ and $2c$, while the numeral "0" at the LSB position is flickered, as shown by display "D" in FIG. 8. At this time, the name/telephone-number data "SUZUKI 0123-45-7890" displayed on the LCD 2 is stored in the display register of the RAM 6.

If the $S_3$ key is operated in this state, "1" is written in the flag register L to set "L = 1", and the EEPROM 7 is selected. As a result, as shown by display "E" in FIG. 8, the "keep" mark display portion $2e$ of the LCD 2 is flickered. The flickered "keep" mark "K" indicates that the name/telephone-number data "SUZUKI 0123-45-7890" displayed on the LCD 2 is stored/kept in the EEPROM 7.

If the $S_4$ key is operated in the state shown in display "E" in FIG. 8, the value of the register L is inverted to "0". That is, the $S_4$ key inverts the content of the register L.

If the $S_2$ key is operated in the state shown in display "E" in FIG. 8, data storage processing with respect to the EEPROM 7 in step A12 is executed. This processing will be described in detail below with reference to FIG. 9. As described above, if the $S_2$ key is operated in the state of "M = 1, F = 1", the flow advances from step A6 to step A12 through steps A7, A8, A10, and A11.

In step B1, the name/telephone-number data "SUZUKI 0123-45-7890" stored in the display register of the RAM 6 is written in one of the TEL data memories $D_0, D_1, D_2, \ldots$ of the EEPROM 7 which is designated by the register $P_1$, e.g., the TEL data memory $D_n$.

In step B2, the name/telephone-number data stored in the TEL data memory Dn designated by the register $P_1$ is read out to check whether the data is properly written.

In step B3, it is checked whether the name/telephone-number data read out from the EEPROM 7 coincides with the name/telephone-number data "SUZUKI 0123-45-7890" stored in the display register. If YES in step B3, it means that the data is properly stored, and the flow advances to step B4. If NO in step B3, the flow advances to step B6. Since the EEPROM 7 is a memory element in which data is less easily written as compared with a RAM, a write operation must be repeated several times.

For this reason, initially, the name/telephone-number data read out from the EEPROM 7 does not coincide with the name/telephone-number data stored in the display register at first, and NO is obtained in step B3. Hence, the flow advances to step B6. In step B6, the content of the register S is incremented by one to count the number of data write operations. In step B7, it is checked whether the content of the register S is "20" or more. If YES in step B7, the flow advances to step B8. If NO in step B7, the flow returns to step B1, and the processing in steps B1 to B3, B6, and B7 is repeatedly executed.

If the write operation with respect to the EEPROM 7 is repeated several times in this manner, and the data is properly written, YES is obtained in step B3, and the flow advances to step B4. In step B4, a stored value N of the data write count storage area DZ of the TEL data memory $D_n$ designated by the register P1 is incremented by one. In step B5, the reservation completion mark (R) display portion $2d$ of the LCD 2 is driven to indicate that the write operation of the displayed name/telephone-number data with respect to the EEPROM 7 is completed. After step B5 is executed, the processing in FIG. 9 is ended, and the flow returns to step A1. As a result, in the display processing in step A3, the name/telephone-number data "SUZUKI 0123-45-7890" is displayed on the LCD 2 together with the "keep" mark "K" and the reservation completion mark "R", as shown in by display "A" in FIG. 10.

The content of the data write count storage area DZ is displayed upon operation of the $S_5$ key. If the $S_5$ key is operated in the display state "A" shown in FIG. 10, YES is obtained in steps A24, A25, and A26, and the flow advances to step A27. In step A27, as shown in display "B" in FIG. 10, the data write count, e.g., "230", stored in the area DZ of the TEL data memory of the EEPROM 7, in which the displayed name/telephone-number data "SUZUKI 0123-45-7890" is stored, is displayed on the LCD 2 together with the name data "SUZUKI".

Referring to FIG. 9 again, if the processing in steps B1 to B3, B6, and B7 is executed 20 times, and the content of the register S becomes "20", YES is obtained in step B7, and the flow advances to step B8. In step B8, since the data cannot be properly written in the EEPROM 7 after the write operation is repeated 20 times, battery voltage detection processing is performed to detect the voltage of the lithium battery 9. More specifically, the battery voltage detecting section 10 outputs the detection signal b when a driving voltage for the EEPROM 7, which is output from the power supply circuit 8 in accordance with the voltage of the lithium battery 9, is decreased below the rated voltage of 2 V. In step B9, it is checked whether the voltage of the lithium battery 9 is sufficiently high, i.e., the detection signal b is output.

If the detection signal b is output, it means that the voltage of the lithium battery 9 is not sufficiently high, and NO is obtained in step B9. The flow then advances to step B10. In step B10, data "1" is written in the register B to indicate that the cause for the disabled write operation with respect to the EEPROM 7 is a decrease in voltage of the lithium battery 9. After step B10 is executed, the processing in FIG. 9 is ended, and the flow returns to step A1. As a result, in the display processing in step A3, a message "Bat. Err" indicating a disabled write operation due to a decreases in voltage is displayed on the dot matrix display portion 2a of the LCD 2, as shown in FIG. 11. With this message display, the user can know that the battery has been consumed.

If the detection signal b is not output, it means that the voltage of the lithium battery 9 is sufficiently high. Hence, YES is obtained in step B9, and the flow advances to step B11. In step B11, data "2" is written in the register B to indicate that the disabled write operation with respect to the EEPROM 7 is caused by an excessive data write count. After step B11 is executed, the processing in FIG. 9 is ended, and the flow returns to step A1. As a result, in the display processing in step A3, a message "Over Err" indicating a disabled write operation due to an excessive data write count is displayed on the dot matrix display portion 2a of the LCD 2, as shown in FIG. 12. With this message display, the user can know that the data write count limit of a given area of the EEPROM 7 is exceeded.

Although the process of storing data in the RAM 6 in step A13 in FIG. 7 is not described in detail in the above embodiment, it should be noted that input data are sequentially stored in areas in which no data are stored. Data to be stored in the RAM 6 and the EEPROM 7 are not limited to name/telephone-number data, but schedule data, address data, memo data, and the like may be stored. In addition, data to be stored are not limited to key-input data, but input data transferred by data communication or data input by radio or the like may be stored.

Second Embodiment

FIGS. 13 to 19 show the second embodiment of the present invention. In the first embodiment described above a power supply voltage is directly detected by using the comparator 10a. In the second embodiment, however, the remaining service life of a battery is determined on the basis of the number of days which have elapsed since the last battery replacement.

Figure 13:
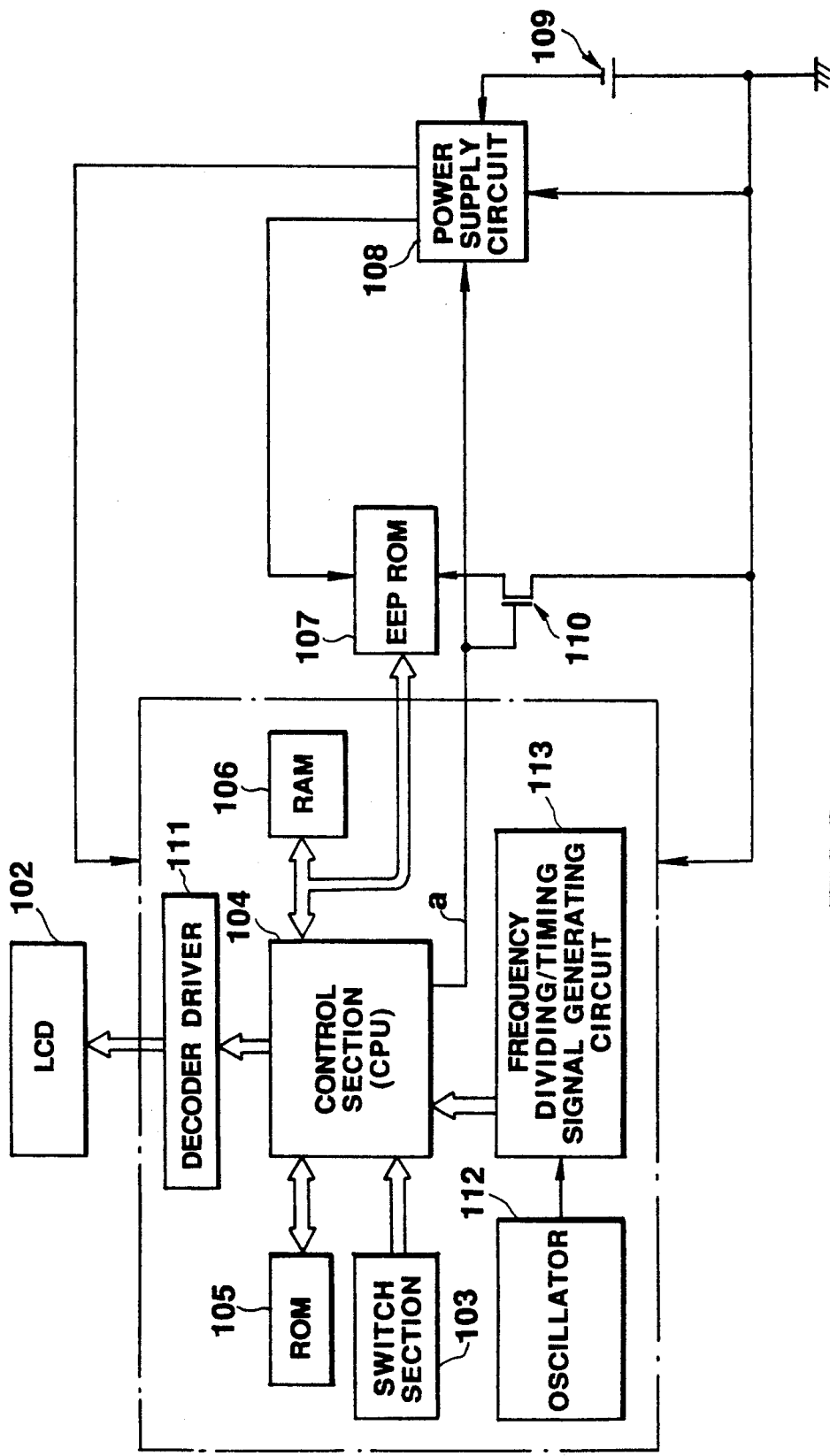

FIG. 13 is a block diagram showing the circuit arrangement of an electronic wristwatch to which the second embodiment is applied. Referring to FIG. 13, a switch section 103 includes $S_1$ to $S_6$ keys and serves to output a key input signal corresponding to a key input to a control section 104. The control section (CPU) 104 is a central processing unit for performing various types of processing on the basis of microprograms stored in a ROM 105 in advance. Note that day count data E corresponding to a battery service life (e.g., if a battery service life is 365 days, 335 days are set as the day count data E to inform the need of battery replacement 30 days before the end of the service life) is stored in the ROM 105 in advance in addition to the microprograms.

Figure 14:
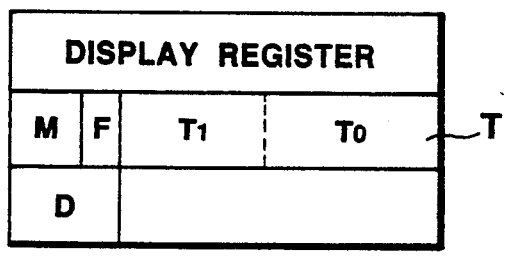

A RAM 106 as a volatile memory serves to store various types of data and has various types of registers, as shown in FIG. 14. Referring to FIG. 14, a display register is a register for storing display data to be displayed on an LCD 102. A mode register M stores mode data. A flag register F stores a battery service life flag indicating that the end of a battery service life is detected. A register T stores current time data and is constituted by registers $T_1$ and $T_0$. The register $T_1$ stores year/month/day data of the current time data. The register $T_0$ stores hour/minute/second data of the current time data. A register D stores data count data based on the number of days which have elapsed since the last battery replacement.

Figure 15:
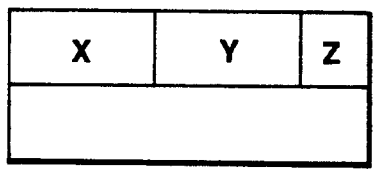

Referring to FIG. 13, an EEPROM (electrically erasable and programmable read only memory) 107 is a nonvolatile memory capable of preserving stored contents when the power supply is turned off, allowing rewrite operations. As shown in FIG. 15, the EEPROM 107 comprises a register X for storing current date data, a register Y for storing battery replacement date data, a register Z for storing battery replacement count data, and the like.

Referring to FIG. 13 again, a power supply circuit 108 applies a driving voltage (1.5 V) to the respective components in accordance with a voltage (3 V) applied from a lithium battery 109, and also applies a predetermined driving voltage (2 V) to the EEPROM 107. A MOS transistor 110 is a gate element for controlling the supply of power to the EEPROM 107. More specifically, the MOS transistor 110 is turned on in response to a signal a output from the control section 104 to connect the EEPROM 107 to the ground voltage (GND).

A decoder driver 111 outputs a display driving signal, based on display data output from the control section 104, to the LCD 102. An oscillator 112 incorporates a quartz oscillator and outputs, e.g., a 32k(32768)Hz clock pulse to a frequency dividing/timing signal generating circuit 113. The frequency dividing/timing signal generating circuit 113 frequency-divides the clock pulse supplied from the oscillator 112 to generate various types of timing signals such as a timepiece signal. The circuit 113 then outputs the timing signals to the control section 104.

Figure 16:
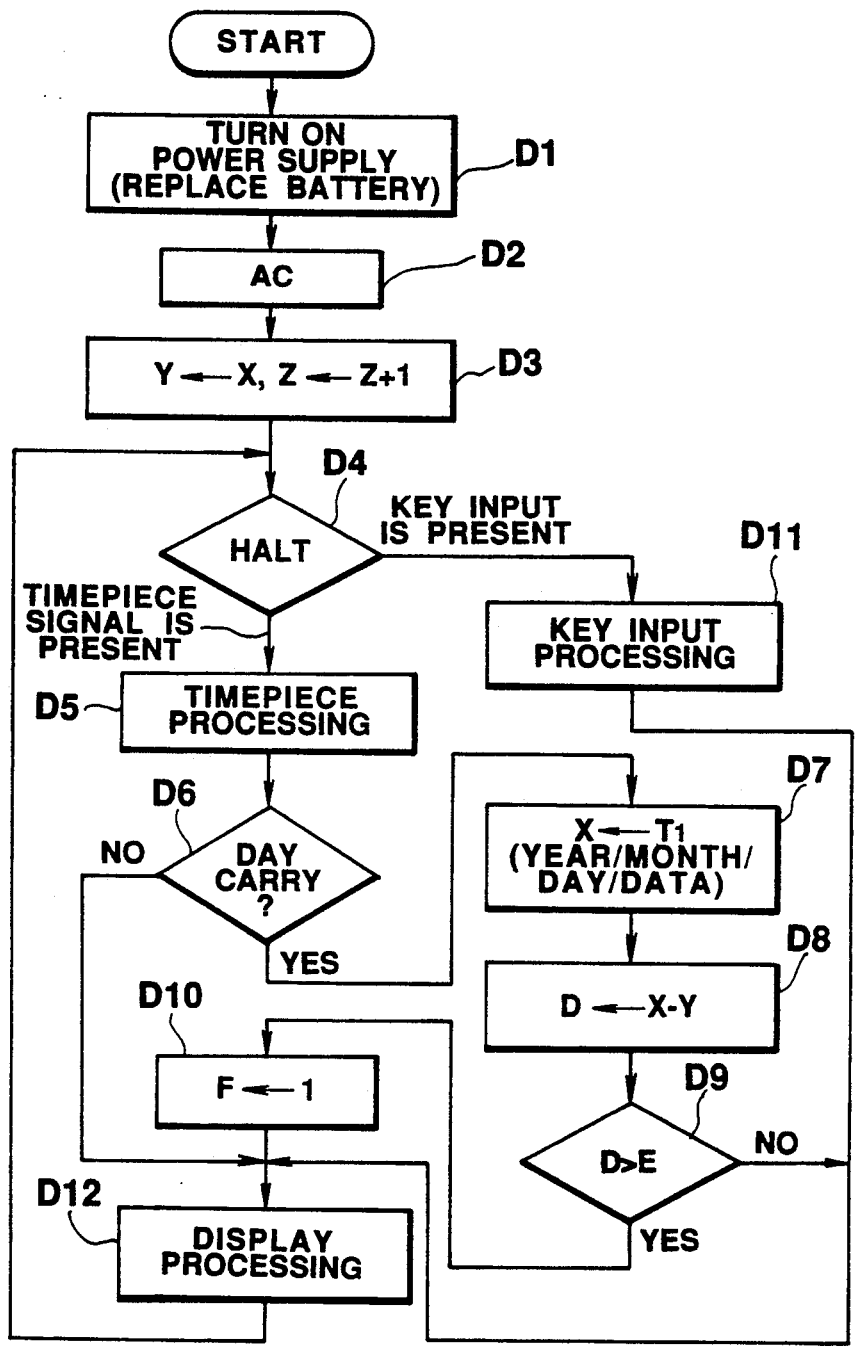
Figure 17:
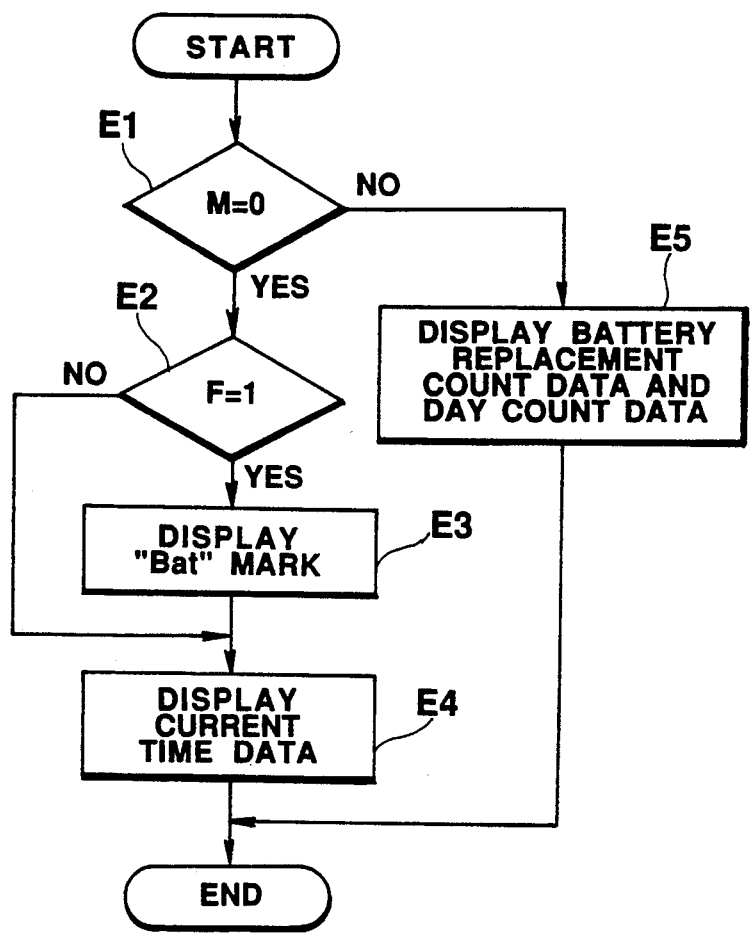

An operation of the second embodiment will be described below with reference to FIGS. 16 to 18. FIG. 16 is a flow chart showing the overall operation. FIG. 17 is a flow chart showing a sequence of operations in display processing in FIG. 16.

The overall operation will be described first with reference to FIG. 16.

When the lithium battery 109 is replaced, step D1 is executed to turn on the power supply, thus supplying power to the respective components. When an initialization switch (not shown) in a battery case is operated by a user, the flow advances to step D2. In step D2, an AC (all clear) signal is output to initialize the respective circuits such as the RAM 106 except for the EEPROM 107. The AC signal may be automatically output when a battery is replaced. In step D3, the current date data (to be described later) stored in the register X of the EEPROM 107 is written in the register Y to update the battery replacement date data, and the battery replacement count data stored in the register Z is incremented by one. Note that the processing in step D3 is to be executed only once regardless of the number of times that the initialization switch is operated within a predetermined period of time. That is, the processing in steps D1 to D3 is executed only once at the time of battery replacement but is not executed after the battery replacement. After step D3 is executed, the flow advances to step A4.

The control section 104 is normally kept in a HALT state in step D4 until a timepiece signal is output from the frequency dividing/timing signal generating circuit 113. When a timepiece signal is output, the presence of the timepiece signal is determined in step D4, and the flow advances to step D5. In step D5, timepiece processing is performed to update the current time data stored in the register T. In step D6, it is checked whether a date carry is present in the timepiece processing, i.e., the date data of the current time data (year/month/day and hour/minute/second data) is updated. If YES in step D6, the flow advances to step D7. If NO in step D6, the flow advances to step D12.

If a date carry is present, the flow advances from step D6 to step D7. In step D7, the year/month/day data of the current time data stored in the register $T_1$ is written in the register X of the EEPROM 107, thus updating the current date data in the register X. In step D8, "X (date) - Y (date)" is calculated, i.e., the battery replacement date data in the register Y is subtracted from the current date data in the register X, thus calculating day count data (elapsed day count data) based on the number of days between the two dates, i.e., the number of days which have elapsed since the last battery replacement. The calculated day count data, e.g., "130 (days)" is then written in the register D of the RAM 106. In step D9, it is checked whether $D > E$, i.e., the day count data "130 (days)" stored in the register D exceeds the battery service life data stored in the ROM 105 in advance. If, for example, the battery service life is "365 days", "335 days" are set as the battery service life data E to detect the end of the batter service life 30 days before the actual end of the battery service life. If YES in step D9, i.e., it is determined that the battery service life has come to an end, the flow advances to step D10. If NO in step D9, the flow advances to step D12. In step D10, "1" is written in the flag register F to set/store the battery service life display flag. The flow then advances from step D10 to step D12.

The display processing will be described in detail below with reference to FIG. 17. In step E1, it is checked whether "M =0" is set, i.e., the content of the mode register M is "0". If YES in step E1, the flow advances to step E2. If NO in step E1, the flow advances to step E5.

If M =0, YES is obtained in step E1, and the flow advances to step E2. In step E2, it is checked whether "F = 1" is set, i.e., the content of the flag register F is "1". If YES in step E2, the flow advances to step E3. If NO in step E2, the flow advances to step E4.

If the end of the battery service life i not detected, F is 0, and NO is obtained in step E2. As a result, the flow advances to step E4. In step E4, as indicated by display "A" in FIG. 18, current time data "SUN 191 3-24 10:56 56" stored in the register T is displayed on the LCD 102.

If step D10 is executed, and "F = 1" is set, since the end of the battery service life is detected, YES is obtained in step E2, and the flow advances to step E3. In step E3, as indicated by display "B" in FIG. 18, "BAT." mark is displayed on the LCD 2. The flow then advances from step E3 to step E4 to display the current time data "SUN 191 3-24 10:56 56" and the "BAT." mark on the LCD 102, as indicated by display "B" in FIG. 18. Upon execution of step E4, the display processing in FIG. 17 is completed, and the flow returns to step D4.

Figure 18:
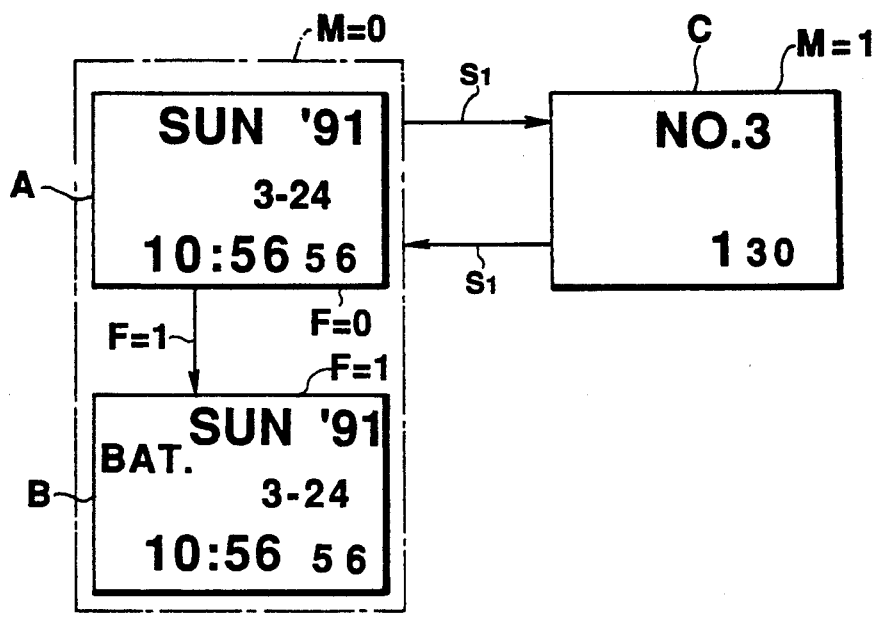

If the $S_1$ key is operated in the display state indicated by display "A" in FIG. 18, the presence of a key input is determined in step D4, and the flow advances to step D11. In step D11, since the $S_1$ key is operated, the content of the mode register M is inverted to set "M = 1". The flow then advances from step D11 to step D12 to perform display processing. In this case, since "M = 1" is set, NO is obtained in step E1, and the flow advances to step E5. In step E5, the battery replacement count data, e.g., "No. 3", stored in the register Z of the EEPROM 107 and the day count data, e.g., "130 (days)", stored in the register Z are displayed on the LCD 102, as indicated by display "C" in FIG. 18.

With this operation, the user can know that the battery replacement count is three, and the number of days (elapsed day count) which have elapsed since the last battery replacement is 130.

Figure 19:
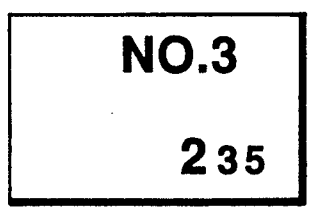

Although the day count "130" is displayed in the above embodiment, the number of remaining days of the battery service life may be displayed. In this case, the day count data "130" is subtracted from the battery service life data "365" to obtain remaining day count data "235" during which the battery can be used. In the display processing, as shown in FIG. 19, the battery replacement count data "No. 3" and the remaining day count data "235" may be displayed on the LCD 102.

In the above embodiment, the need of battery replacement is determined, and the current time is written in the nonvolatile memory in accordance with switching operations. However, the present invention is not limited to this. For example, a detecting unit for detecting a battery voltage may be arranged so that when the battery voltage is decreased below a predetermined voltage, the current time is automatically written, as battery replacement date data, in the nonvolatile memory.

As has been described in detail above, according to this embodiment, when a battery is replaced, the date of battery replacement is stored, as battery replacement date data, in the nonvolatile memory. The end of the battery service life is detected and informed on the basis of this battery replacement date data. Therefore, when the battery voltage is temporarily decreased due to a low temperature or the like, a user does not erroneously determine that the battery service life has come to an end. That is, the user can properly determine the end of a battery service life. In addition, since a battery replacement count is displayed, the user can know how long the watch has been used.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A data storage apparatus comprising:
   a battery power supply;
   data input means for inputting data;
   nonvolatile memory means, to which a power supply voltage is applied from said battery power supply, for storing the data input by said data input means; and
   storage control means for storing the data input by said data input means in said nonvolatile memory means by control of microprograms, said storage control means comprising:
      write determination means for determining whether the data input by said data input means is correctly written in said nonvolatile memory means;
      first informing means for, when said write determination means determines that the data is correctly written, informing that the data is correctly written;

voltage detecting means for detecting whether a voltage of said battery power supply is lower than a predetermined voltage immediately after said write determination means determines that the data is not correctly written;

second informing means for, when said voltage detecting means detects that the voltage of said battery power supply is lower than the predetermined voltage, informing that the data is not written because of a decrease in voltage of said battery power supply; and third informing means for, when said voltage detecting means detects that the voltage of said battery power supply is higher than the predetermined voltage, giving information different from information from said second informing means.

2. An apparatus according to claim 1, wherein said nonvolatile memory means comprises an EEPROM.

3. An apparatus according to claim 1, further comprising display means for sequentially displaying data stored in said nonvolatile memory means.

4. An apparatus according to claim 1, wherein said write determination means comprises count means for counting the number of times that the data is stored in said nonvolatile memory means, and means for determining whether the number of times obtained by said count means reaches a predetermined value.

5. An apparatus according to claim 1, further comprising a timepiece circuit for obtaining time information by counting reference signals, and time display means for displaying the time information obtained by said timepiece circuit.

6. An apparatus according to claim 1, wherein said data storage apparatus is incorporated in a case of a watch type device worn on a wrist of a user.

7. A data storage apparatus according to claim 1, further comprising:

date count means for obtaining current date data by counting reference signals;

data storage control means for causing said nonvolatile memory means to store the date data obtained by said date count means when said battery power supply is replaced;

battery service life calculating means for obtaining battery service life data on the basis of the date data stored in said nonvolatile memory means by said date storage control means and the current date data obtained by said date count means; and display means for displaying the battery service life data obtained by said battery service life calculating means.

8. An apparatus according to claim 1, wherein said third informing means informs that the data is not written because of a reason other than the level of the voltage of said battery power supply.

9. An apparatus according to claim 8, wherein said nonvolatile memory means includes an EEPROM.

10. An apparatus according to claim 8, wherein the battery service life data obtained by said battery service life calculating means is the number of days which have elapsed since the last battery replacement.

11. An apparatus according to claim 8, wherein the battery service life data obtained by said battery service life calculating means is the number of remaining days up to the next battery replacement.

12. An apparatus according to claim 8, further comprising indication means for indicating that the date data is written in said nonvolatile memory means.

13. An apparatus according to claim 8, further comprising count means for counting the number of times that battery replacement is performed, and a battery replacement count display means for displaying the number of times counted by said count means.

14. An apparatus according to claim 8, further comprising a timepiece circuit for obtaining time information by counting reference signals, and time display means for displaying the time information obtained by said timepiece circuit.

15. An apparatus according to claim 8, wherein said data storage apparatus is incorporated in a case of a watch type device worn on a wrist of a user.

16. A data storage apparatus comprising:

a battery power supply;

data input means for inputting data;

volatile memory means for storing the data input by said data input means;

nonvolatile memory means, operated by a power supply voltage from said battery power supply, for storing the data input means;

selection switch means for selecting one of said volatile memory means and said nonvolatile memory means in which the data input by said data input means is stored;

first storage control means for causing said volatile memory means to store the data input by said data input means when said volatile memory means is selected by said selection switch means;

second storage control means for causing said nonvolatile memory means to store the data input by said data input means when said nonvolatile memory means is selected by said selection switch means;

write determination means for determining whether the data is correctly written in said nonvolatile memory means by said second storage control means;

first informing means for, when said write determination means determines that the data is correctly written, informing that the data is correctly written;

voltage detecting means for detecting a voltage of said battery power supply when said write determination means determines that the data cannot be correctly written;

second informing means for, when said voltage detecting means detecting that the voltage of said battery power supply is lower than the predetermined voltage, informing that the data is not written because of a decrease in voltage of said battery power supply; and third informing means for, when said voltage detecting means detects that the voltage of said battery power supply is higher than the predetermined voltage, giving information different from information from said second informing means.

17. An apparatus according to claim 16, wherein said volatile memory means includes a RAM and said nonvolatile memory means includes an EEPROM.

18. An apparatus according to claim 16, wherein said display means comprises first display means for sequentially displaying data stored in said volatile memory means, and second display means for sequentially display data stored in said nonvolatile memory means.

19. An apparatus according to claim 16, wherein said third informing means informs that the data is not written because of a reason other than the level of the voltage of said battery power supply.

20. An apparatus according to claim 16, further comprising a power supply circuit for respectively applying different driving voltages to said volatile memory means and said nonvolatile memory means on the basis of an output voltage from said battery power supply.

21. An apparatus according to claim 16, wherein said write determination means comprises count means for counting the number of times that the data is stored in said nonvolatile memory means, and storage operation count display means for displaying the number of times obtained by said count means.

22. An apparatus according to claim 16, further comprising a timepiece circuit for obtaining time information by counting reference signals, and time display means for displaying the time information obtained by said timepiece circuit.

23. An apparatus according to claim 16, wherein said data storage apparatus is incorporated in a case of a watch type device worn on a wrist of a user.

* * * * *